United States Patent
Li

(10) Patent No.: US 10,312,155 B2
(45) Date of Patent: Jun. 4, 2019

(54) FINFET DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/784,357

(22) Filed: Oct. 16, 2017

(65) Prior Publication Data
US 2018/0108574 A1  Apr. 19, 2018

(30) Foreign Application Priority Data
Oct. 18, 2016  (CN) .......................... 2016 1 0907894

(51) Int. Cl.
| | | |
|---|---|---|
| H01L 21/8238 | (2006.01) | |
| H01L 29/78 | (2006.01) | |
| H01L 21/225 | (2006.01) | |
| H01L 29/66 | (2006.01) | |
| H01L 27/092 | (2006.01) | |

(52) U.S. Cl.
CPC .. *H01L 21/823821* (2013.01); *H01L 21/2254* (2013.01); *H01L 21/823814* (2013.01); *H01L 21/823878* (2013.01); *H01L 29/6659* (2013.01); *H01L 29/66636* (2013.01); *H01L 29/66803* (2013.01); *H01L 29/785* (2013.01); *H01L 21/2255* (2013.01); *H01L 27/0924* (2013.01); *H01L 29/7833* (2013.01)

(58) Field of Classification Search
None
See application file for complete search history.

(56) References Cited

U.S. PATENT DOCUMENTS

| | | |
|---|---|---|
| 2013/0122676 A1 | 5/2013 | Jeng |
| 2015/0255606 A1 | 9/2015 | Cheng et al. |

(Continued)

OTHER PUBLICATIONS

The European Patent Office (EPO) The Extended European Search Report for 17196528.8 dated Feb. 21, 2018 10 Pages.

*Primary Examiner* — Asok K Sarkar
(74) *Attorney, Agent, or Firm* — Anova Law Group, PLLC

(57) ABSTRACT

A FinFET device and fabrication method thereof is provided. The fabrication method include: providing a semiconductor substrate with a fin protruding from the semiconductor substrate, and a gate structure across a length portion of the fin and covering a portion of the fin; etching a partial thickness of the fin on both sides of the gate structure to form grooves; forming a doped layer in a bottom and sidewalls of the grooves; annealing the doped layer to allow the doping ions to diffuse into the fin and to form a lightly doped source/drain region; removing the doped layer after the annealing; and forming epitaxial layers to fill up the grooves.

19 Claims, 8 Drawing Sheets

(56) References Cited

U.S. PATENT DOCUMENTS

| | | | |
|---|---|---|---|
| 2016/0071934 A1* | 3/2016 | Cea | H01L 29/66545 257/192 |
| 2016/0104776 A1 | 4/2016 | Ching et al. | |
| 2016/0293701 A1* | 10/2016 | Liao | H01L 29/0847 |
| 2018/0151695 A1* | 5/2018 | Huang | H01L 29/66545 |
| 2018/0197783 A1* | 7/2018 | Ching | H01L 29/785 |

* cited by examiner

FINFET DEVICE AND FABRICATION METHOD THEREOF

CROSS-REFERENCES TO RELATED APPLICATION

This application claims the priority of Chinese Patent Application No. 201610907894.1, filed on Oct. 18, 2016, the content of which is incorporated by reference in its entirety.

TECHNICAL FIELD

The present disclosure generally relates to the field of semiconductor technologies and, more particularly, relates to a fin field effect transistor (FinFET) device and its fabrication method.

BACKGROUND

The semiconductor technology node becomes smaller and smaller following the development tendency of Moore's law, with the continuous development of the semiconductor technology. Accordingly, the channel length of a metal-oxide-semiconductor field-effect transistor (MOSFET) has to decrease. This provides advantages of increasing density of the semiconductor elements and the switching speed of the MOSFET.

However, the distance between the source and drain electrodes of a device also decreases, as the channel length decreases. Correspondingly, the controlling ability of the gate structure over the channel becomes worse, and it also becomes harder for the gate voltage to pinch off the channel. As a result, sub-threshold leakage, also known as short-channel effects (SCE), may easily occur.

To better adapt to the decreased size of the devices, focuses of the semiconductor technology have gradually changed from planar MOSFETs to more effective non-planar three-dimensional transistors, such as fin field effect transistors (FinFETs). In a FinFET, the gate structure can control an ultra-thin part (fin) from two sides of the fin, to provide a much stronger controlling ability on the channel and to effectively suppress the short-channel effect. Moreover, compared with other devices, FinFET is more compatible with the present fabrication processes for integrated circuits.

However, performance of conventionally fabricated FinFET devices still needs to be improved. The disclosed devices and methods are directed to at least partially alleviate one or more problems set forth above and to solve other problems in the art.

SUMMARY

One aspect of the present disclosure provides a method of forming a FinFET. In the method, a semiconductor substrate with a fin protruding from the semiconductor base is provided. A gate structure on the semiconductor substrate crosses a length portion of the fin and covers a portion of a top and sidewalls of the fin. Grooves are formed by etching a partial thickness of the fin on both sides of the gate structure. A doped layer with doping ions is formed in a bottom and sidewalls of the grooves. The doped layer is annealed to allow the doping ions to diffuse into the fin and to form a lightly doped source/drain region. The doped layer is removed after the annealing. Epitaxial layers is formed to fill up the grooves.

Another aspect of the present disclosure provides a FinFET. The FinFET includes a fin protruding from a semiconductor substrate; a gate structure on the semiconductor substrate across a length portion of the fin and covering a portion of a top and sidewalls of the fin; epitaxial layers in the fin on both sides of the gate structure, the epitaxial layers have a thickness less than the fin; and a lightly doped source/drain region between the epitaxial layers and the gate structures.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
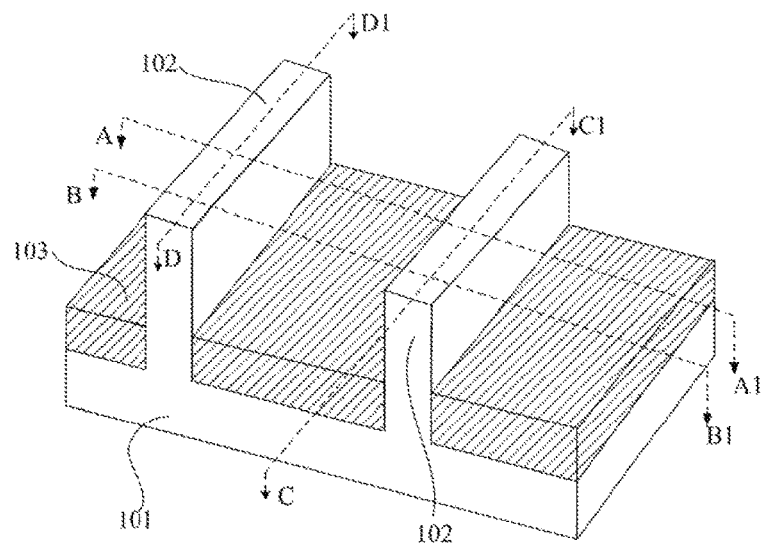
FIG. 1 to FIG. 22 illustrate semiconductor structures corresponding to certain stages for forming an exemplary FinFET device according to various disclosed embodiments of present disclosure.

Reference will now be made in detail to exemplary embodiments of the disclosure, which are illustrated in the accompanying drawings. Wherever possible, the same reference numbers will be used throughout the drawings to refer to the same or like parts.

To improve the performance of FinFET devices, a FinFET device may be formed by: etching a portion of a fin on the sides of a gate structure by removing a partial thickness to form grooves in the fin, performing an ion implantation on the sidewalls of the grooves adjacent to the gate structure to form a lightly doped source/drain region, and forming epitaxial layers to fill the grooves.

The epitaxial layers provide the foundation for preparing a heavily-doped source/drain region in the FinFET device. However, the epitaxial layers have a large number of defects and poor surface profile. Correspondingly the prepared FinFET device has poor electrical performance.

When ions bombard the surface of the exposed portion of the fin on the bottom and sidewalls of the grooves to form the lightly doped source/drain regions during ion implantation, damages may be caused on the crystal lattice at the bottom and sidewalls of the grooves. Correspondingly, the epitaxial layers have a large number of defects and poor surface profile when they are formed on the bottom and sidewalls of the grooves, because of the poor quality of the crystal lattice in the exposed portion of the fins on the bottom and sidewalls of the grooves.

The present disclosure provides a FinFET device and fabricating method. The fabrication method includes: providing a base substrate with a fin protruding from the base substrate; forming a gate structure on the base substrate across a length portion of the fin and covering a portion of the top and sidewalls of the fin; etching a portion of the fin on the both sides of the gate structure by removing a partial thickness to form grooves; forming a doped layer with P-type or N-type doping ions on the bottom and the sidewalls of the above grooves; annealing the doped layer to make the doping ions diffuse into the fin and to form a lightly doped source/drain region; removing the doped layer after annealing; and forming epitaxial layers in the groove. As such, quality of the epitaxial layers can be improved and electrical performance of the formed FinFET device can be subsequently enhanced.

FIG. 1 to FIG. 22 illustrate semiconductor structures corresponding to certain stages for forming an exemplary FinFET device according to various disclosed embodiments of present disclosure. FIG. 23 illustrates an exemplary method for forming a FinFET device according to various disclosed embodiments.

Although the formed FinFET device is illustrated as a CMOS device, with a base substrate having a PMOS region I and an NMOS region II, as shown in FIGS. 1-22, any other suitable structures may be included in the FinFET device according to various embodiments of the present disclosure. For example, the FinFET device may not include a CMOS device and may include a base substrate only having a PMOS region or only having an NMOS region.

Figure 2:
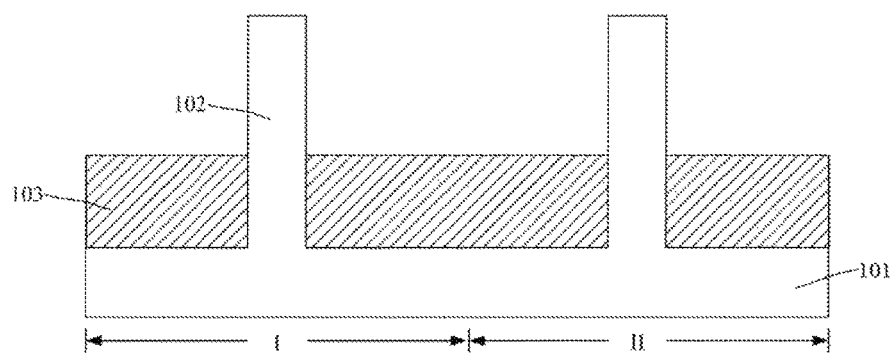

FIG. 1 illustrates a three-dimensional structure for forming the disclosed device, and FIG. 2 is the cross-sectional view of the structure along the A-A1 direction in FIG. 1.

As shown in FIG. 1 and FIG. 2, a base substrate may include a semiconductor substrate 101 with fins 102 protruding from the semiconductor substrate 101, which provides a platform for subsequently forming the FinFET device (e.g., Step 802 in FIG. 23). The base substrate may further include an isolation layer 103 on the semiconductor substrate 101. The fins 102 may protrude from the semiconductor substrate 101. The isolation structure 103 may cover a portion of the sidewalls of the fins 102. The top of the isolation structure 103 may be lower than the top of the fins 102.

The semiconductor substrate 101 may be made of silicon (Si), germanium (Ge), silicon germanium (SiGe), silicon carbide (SiC), gallium arsenide (GaAs), or indium gallium (InGa). Alternatively, the semiconductor substrate 101 may be a silicon on insulator (SOI) substate or a germanium on insulator (GeOI) substrate. In various embodiments, the semiconductor substrate 101 and the fin 102 may be made of a same or different material. In one embodiment, the semiconductor substrate 101 is a silicon substrate and the fin 102 is made of silicon.

In one embodiment, the semiconductor substrate 101 and the fins 102 may be formed by: providing an initial substrate; forming a patterned hard mask layer on the surface of the initial substrate; and etching the initial substrate by using the patterned hard mask layer as an etch mask to form the semiconductor substrate 101 and the fins 102 protruding from the semiconductor substrate 101.

The isolation layer 103 electrically isolates adjacent fins 102 from each other. The isolation layer 103 may be formed by an insulating material, such as silicon oxide ($SiO_2$), silicon nitride ($Si_3N_4$), silicon oxynitride ($SiO_xN_y$), or silicon carbon oxynitride (SiCON). In one embodiment, the isolation layer 103 is made of $SiO_2$.

Figure 3:
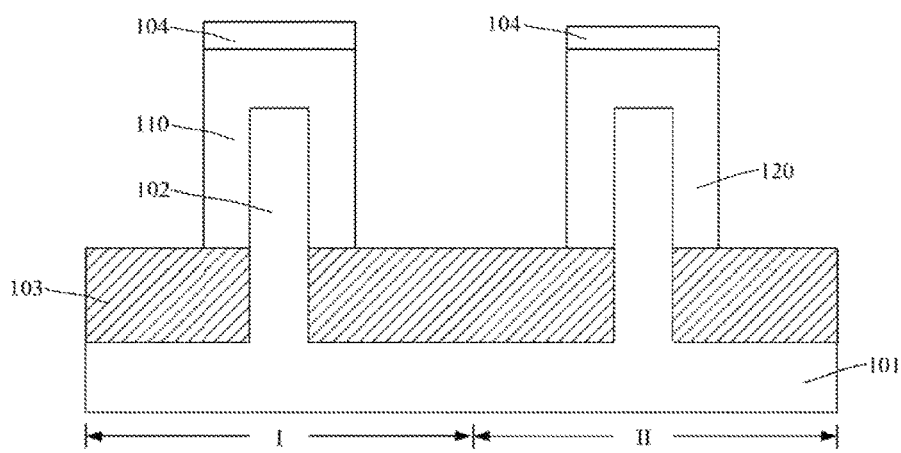

FIG. 3 illustrates a schematic structure based on the structure illustrated in FIG. 2. As shown in FIG. 3, a gate structure may be formed on the base substrate across a length portion of the fins 102 and covering a portion of the top and sidewalls of the fins 102 (e.g., Step 804 in FIG. 23).

In one embodiment, the gate structure may be located on the top of the isolation structure 103 and cross a length portion of the fins 102. The gate structures may include the first gate structure 110 in the PMOS region I and the second gate structure 120 in the NMOS region II. The first gate structure 110 may be located on the isolation structure 103 in the PMOS region I across the fin 102 in the PMOS region I and covering a portion of the top and sidewalls of the fin 102 in the PMOS region I. The second gate structure 120 may be located on the isolation structure 103 in NMOS region II across the fin 102 in the NMOS region II, and covering a portion of the top and sidewalls of the fin 102 in the NMOS region II.

In one embodiment, the first gate structure 110 may be independently disposed from the second gate structure 120. In various embodiments, these two gate structures can be structrually connected.

In one embodiment, the first and second gate structures may each be a metal gate structure. The metal gate structure may include a gate dielectric layer and a gate electrode layer on the top of the gate dielectric layer. The gate dielectric layer may be made of $SiO_2$ or high-k gate dielectric materials. The material of the gate electrode layer may be polycrystalline Si or metals. Such metals may be Ti, Ta, TiN, TaN, TiAl, TiAlN, Cu, Al, W, Ag, Au, or a combination thereof.

In other embodiments, the first and second gate structures may each be a dummy gate structure. The dummy gate structure may be removed in a subsequent process and a metal gate structure for a semiconductor device may be formed at the same position. The dummy gate structure may be single-layer or multilayer structure. The dummy gate structure may include a dummy gate layer or a dummy gate layer on a dummy oxide layer. The dummy oxide layer may be made of $SiO_2$ or $SiO_xN_y$, and the dummy gate layer may be made of polycrystalline silicon or amorphous carbon (C).

In one embodiment, the top of the first gate structure 110 and the second gate structure 120 may be covered by a hard mask layer 104, respectively. The hard mask layers 104 may protect the top surface of the first gate structure 110 and the second gate structure 120 in subsequent processes. The hard mask layers 104 may be made of $SiO_2$, $SiO_xN_y$, SiC and/or boron nitride (BN).

Subsequently, further processes may include: etching a partial thickness of the fins 102 on the both sides of each gate structure to form grooves; forming doped layers with P-type or N-type doping ions in the bottom and the sidewalls of the above grooves; annealing the doped layers to allow the doping ions to diffuse into the fins 102 and to form lightly doped source/drain regions; removing the doped layers after annealing; and forming epitaxial layers to fill up the grooves.

Before forming the grooves, a mask layer may be formed on atop and sidewalls of the fins 102 and on the semiconductor substrate 101. In the process of forming the grooves, a first portion of the mask layer on the top and sidewalls of the fin may also be etched away, and a second portion of the mask layer on the sidewalls of the remaining fins 102 may be retained.

In one embodiment, the gate structures include the first gate structure 110 and the second gate structure 120. The base substrate includes the PMOS region I and the NMOS region II. These two regions are different type. Correspondingly, the grooves may be formed in the fins of both the PMOS region I and the NMOS region II, and the epitaxial layers may be formed in the grooves of both the PMOS region I and the NMOS region II, respectively.

In the following description, the formation of the grooves, the doped layer, the lightly doped source/drain region and the epitaxial layers will be described as an example, along with the accompanying drawings. In one embodiment, as an example, first grooves in the fin 102 of the PMOS region I may be formed before forming second grooves in fin 102 of the NMOS region II, although any order for forming the first and second grooves may be included in the present disclosure.

Figure 4:
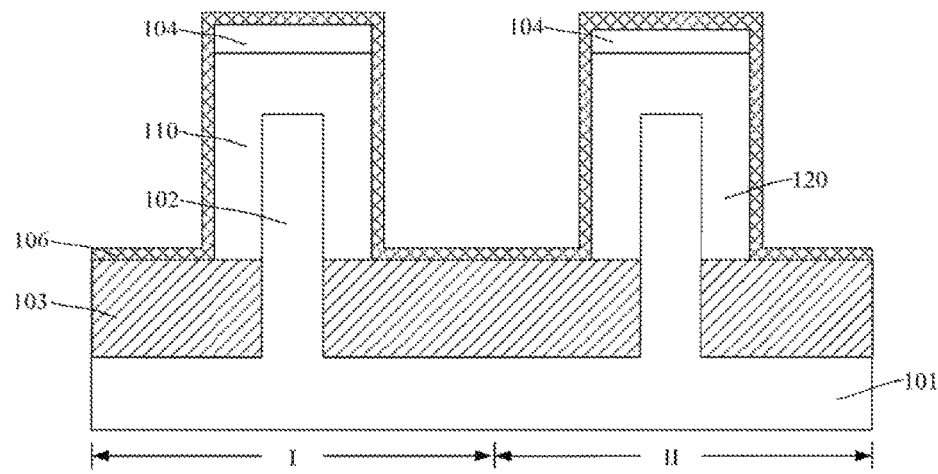
Figure 5:
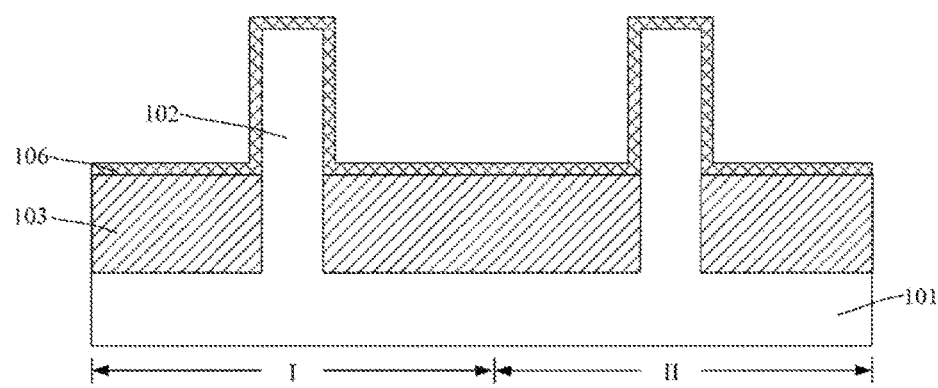

FIG. 4 illustrates a schematic structure based on the structure illustrated in FIG. 3 and FIG. 5 is the cross-sectional view along the B-B1 direction indicated in FIG. 1 which is parallel to A-A1 direction. As shown, a first mask layer 106 may be formed on surface of the base substrate, the top and sidewalls of the fins 102 in the PMOS region I and the NMOS region II.

The first mask layer 106 may be formed by a chemical vapor deposition method, a physical vapor deposition method or an atomic layer deposition method. In one embodiment, the first mask layer 106 is formed by the atomic layer deposition method.

The first mask layer 106 may be located on the top and sidewalls of the gate structures in the PMOS region I and the NMOS region II. The first mask layer 106 may also be formed on the exposed surface of the isolation structure 103.

The first mask layer 106 on the fin 102 in the NMOS region II may function to protect the fin 102 in the NMOS region II when etching a partial thickness of the fin 102 in the PMOS region I to form the first grooves. Moreover, the first mask layer 106 covers the sidewalls of the remaining fin 102 in the PMOS region I after etching a portion of the fin 102 in the PMOS region I and prevents epitaxial growth on sides of the fin 102 in the subsequent selective epitaxial growth process.

The first mask layer 106 may be made of SiN, SiO$_2$, BN, or SiO$_x$N$_y$, which are different from the material(s) used for the fins 102 and the isolation structure 103. In one embodiment, the material of the first mask layer 106 may be SiN, and the thickness may be about 3 nm to about 6 nm.

Figure 6:
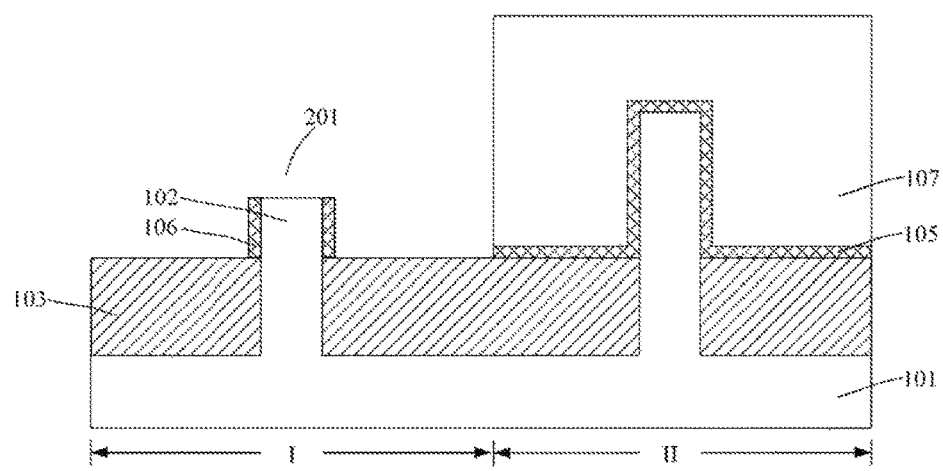
Figure 7:
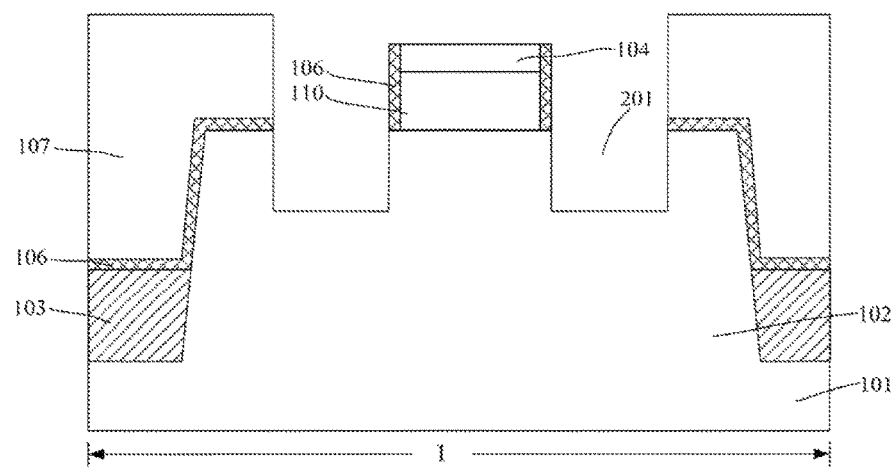

FIG. 6 illustrates a schematic structure based on the structure illustrated in FIG. 5 and FIG. 7 is the cross-sectional view of the structure along the C-C1 direction in FIG. 1. A partial thickness of the fin 102 on the two sides of the first gate structure 110 may be etched to form the first grooves 201 (e.g., Step S806 in FIG. 23), as shown in FIG. 6 and FIG. 7.

A first patterned layer 107 may be formed in the NMOS region II before etching a partial thickness of the fin 102 on sides of the first gate structure 110. The first patterned layer 107 may cover and protect the first mask layer 106 in the NMOS region II. The first patterned layer 107 also may cover and protect a portion of the PMOS region I from being etched.

In one embodiment, the first mask layer 106 on the top of the fin 102 in the PMOS region I may also be etched before etching a partial thickness of the fin 102 in the PMOS region I. Moreover, to reduce the limit on the growth of the first epitaxial layers and to form the first epitaxial layers in the first grooves 201 with big bulk volume in the subsequent process, the first mask layer 106 on the sidewalls of the fin 102 may be etched. And the top of the remaining portion of the first mask layer 106 on the sidewalls of the fin 102 may be at the same height of the top of the remaining fin 102.

The first pattern layer 107 may be removed after forming the first grooves 201. In one embodiment, the first pattern layer 107 may be made of a photoresist material, and may be removed by a wet etching or an ashing process.

Figure 8:
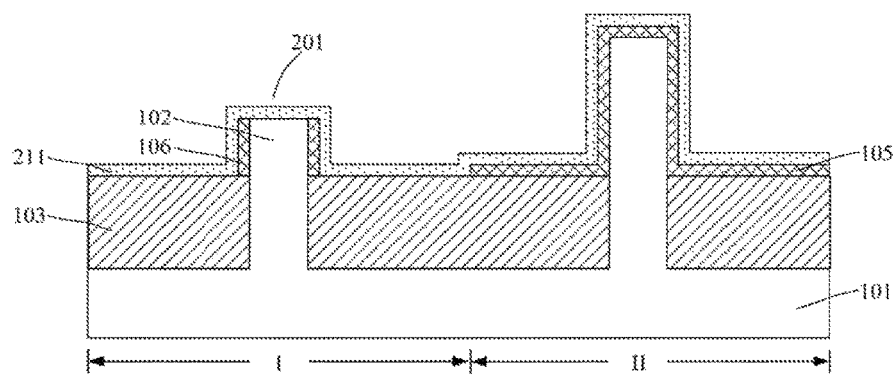
Figure 9:
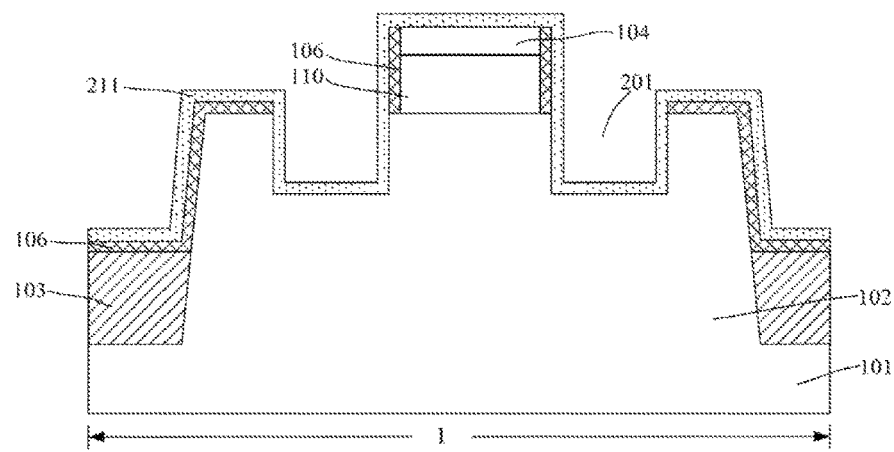

FIG. 8 illustrates the schematic structure based on the structure of FIG. 6, and FIG. 9 illustrates the schematic structure based on the structure in FIG. 7. A first doped layer 211 with P-type ions may be formed on the bottom and sidewalls of the first grooves 201 (e.g., Step S806 in FIG. 23), as shown in FIG. 8 and FIG. 9.

The first doped layer 211 provides the foundation for the first lightly doped source/drain region in the fin 102 of the PMOS region I. The first grooves 201 may have two opposite sidewalls. One sidewall is close to the first gate structure 110, and another sidewall is far away from the first gate structure. The P-type ions in the first doped layer 211 on one sidewall close to the first gate structure 110 may diffuse into the fin 102 in the PMOS region I to form the first lightly doped source/drain region in the portion of the fin 102 close to the first gate structure 110 of the PMOS region I.

The first doped layer 211 may also be located on the surface of the first mask layer 106 in the NMOS region II and in the sidewalls of the remaining fin 102 in PMOS region I. The first mask layer 106 may block the diffusion of the P-type ions from the first doped layer 211 into the fin 102 in the NMOS region II because it is located between the first doped layer 211 and the fin 102 in the NMOS region II. As such, no additional photo-mask layers are needed to cover the fin 102 in the NMOS region II. The fabrication process is therefore simplified.

The first doped layer 211 may be formed using a material that is easy to remove, and the removing process should not damage the fin 102. To achieve this, the first doped layer 211 may be made of SiO$_2$, SiO$_x$N$_y$, or SiO$_x$C$_y$. In one embodiment, the material of the first doped layer 211 may be boron doped SiO$_2$ (i.e., boron-doped silicon glass, BSG), and the concentration of boron ions may be 1E20 atom/cm$^3$~1E21 atom/cm$^3$. In other embodiments, the concentration of the doped ions may be determined by the requirement of the process.

The first doped layer 211 may be formed by a chemical vapor deposition method, a physical vapor deposition method, or an atomic layer deposition method. In one embodiment, an in-situ doping atomic layer deposition method may be used to form the first doped layer 211. This method may make the distribution of the P-type doping ions in the first doped layer 211 uniform and the formed first doped layer 211 may have a high step coverage capability. The thickness of the first doped layer 211 may be highly uniform, so the distribution of the P-type ions diffusing into the portion of the fin 102 close to the first gate structure 110 may also be highly homogenous.

In one embodiment, the thickness of the first doped layer 211 may be about 2 nm to about 10 nm.

Figure 10:
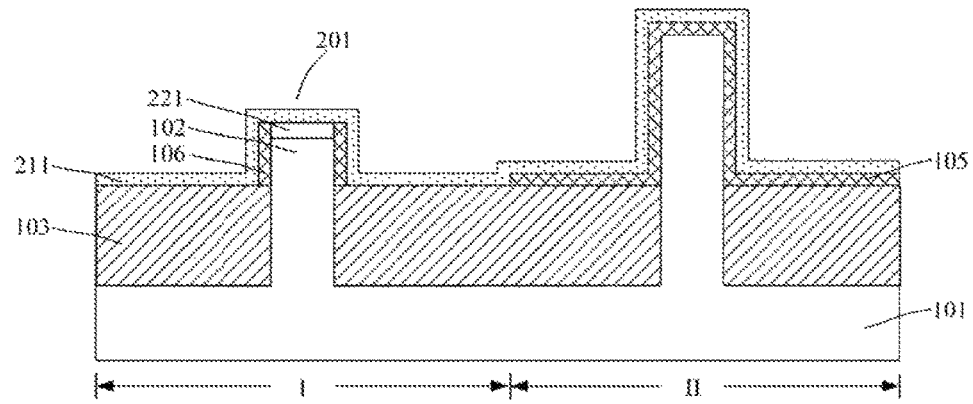
Figure 11:
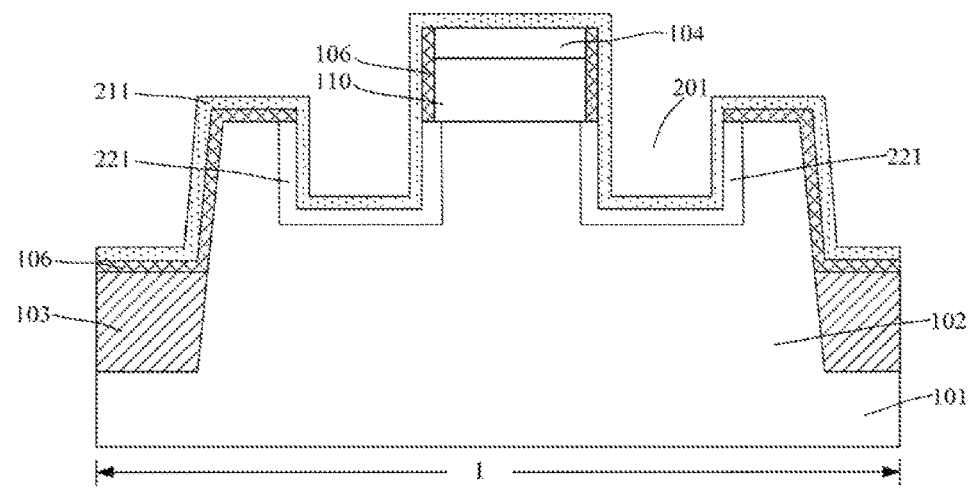

The first lightly doped source/drain region may be formed by a first annealing process on the first doped layer 211 such that P-type ions in the first doped layer 211 diffuse into the fin 102 in the PMOS region I, as shown in FIG. 10 and FIG. 11 (e.g., Step S810 in FIG. 23). FIG. 10 illustrates a schematic structure based on the structure illustrated in FIG. 8 and FIG. 11 illustrates a schematic structure based on the structure illustrated in FIG. 9.

The P-type ions in the first doped layer 211 may diffuse into the fin 102 in the PMOS region I to form the first doped region 221 in a portion of the fin 102 near the bottom and sidewalls of the first grooves 201. The portion of the first doped region 221 near the first gate structure 110 may form the first lightly doped source/drain region.

The annealing method may be a spike annealing or a laser annealing. The annealing temperature may not be too high or too low. If the first annealing temperature is too low, the diffusing capability of the P-type ions in the first doped layer 211 would be too weak. If the first annealing temperature is too high, the diffusing capability of the P-type ions in the first doped layer 211 would be too high, and the distance between the adjacent first lightly doped source/drain regions below the first gate structure 110 would be too small that the electrical shorting effect could happen. In one embodiment, the temperature of the first annealing process is about 900° C. to about 1100° C.

In one embodiment, a solid state source doping method may be used to form the first lightly doped source/drain region in the fin 102 of PMOS region I. The damage on the lattice of the first grooves 201 by the ion implantation process may be prevented to provide the exposed portion of the fin 102 on the bottom and sidewalls of the first grooves 201 with high crystal lattice quality.

Figure 12:
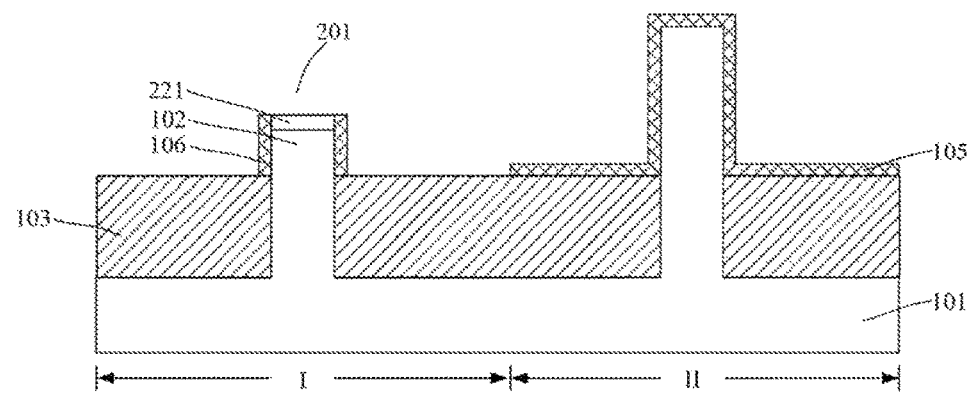
Figure 13:
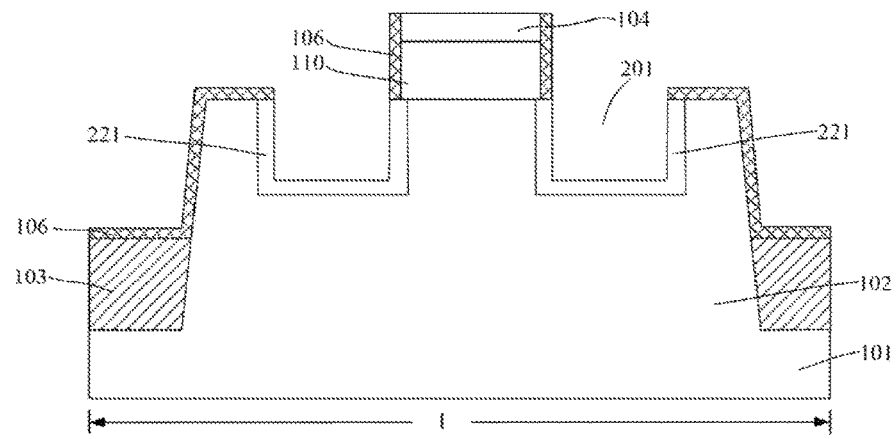

FIG. 12 illustrates the schematic structure based on the structure in FIG. 10, and FIG. 13 illustrates the schematic structure based on the structure in FIG. 11. The first doped layer 211 may be removed, as shown in FIG. 12 and FIG. 13 (e.g., Step S812 in FIG. 23).

For example, a wet etching method may be used to remove the first doped layer 211.

In one embodiment, the first doped layer 211 may be made of $SiO_2$, and may be removed by the hydrofluoric (HF) solution.

Figure 14:
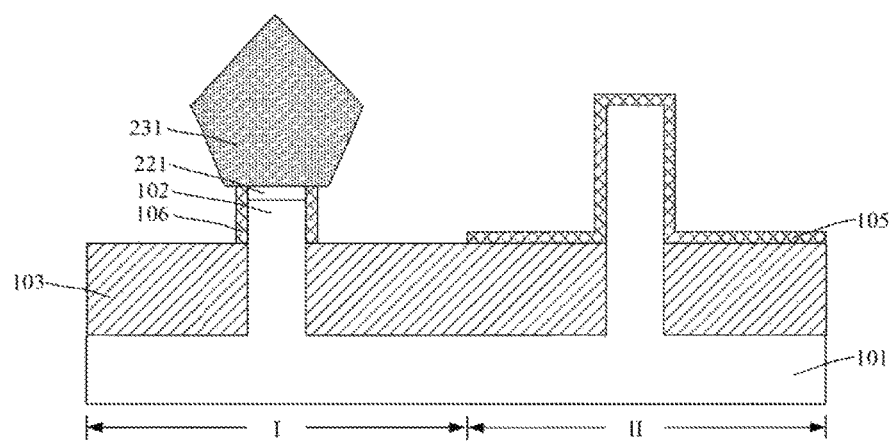

FIG. 14 illustrates the schematic structure based on the structure in FIG. 13. As shown, that first epitaxial layers 231 may be formed to fill up the first grooves 201 (e.g., Step S814 in FIG. 23).

The first epitaxial layers 231 may provide the foundation to prepare the first heavily doped source/drain region in the PMOS region I.

A selective epitaxial growth process may be used to form the first epitaxial layers 231, and the material can be P-type doped silicon or P-type doped SiGe. In this embodiment, the first epitaxial layers 231 may also provide compressive stress to the channel region in the PMOS region I, which may enhance the carrier mobility in the PMOS region I. The top of the first epitaxial layers 231 may be higher than the top of the first grooves 201.

During the selective epitaxial growth process of the first epitaxial layers 231, a first heavily doped source/drain region may be formed by in-situ doping with P-type ions. In other embodiments, P-type ions may be doped in the first epitaxial layers after forming the first epitaxial layers to form the first heavily doped source/drain region. In some embodiments, before the selective epitaxial growth process and the in-situ doping of P-type ions, epitaxial seed layers may be formed on the bottom and sidewalls of the first grooves 201 by a selective epitaxial growth process. The epitaxial seed layers may be formed by a material including silicon or SiGe.

Because the solid state source doping method is used to form the first lightly doped source/drain region, lattice damages that often occurred in an ion implantation method may be avoided. The exposed portion of the fin 102 on the bottom and sidewalls of the first grooves 201 may have excellent lattice quality. Correspondingly, the first epitaxial layers 231 formed by the selective epitaxial growth process may have a small number of defects, and the performance may be improved. When preparing the epitaxial seed layers on the bottom and sidewalls of the first grooves 201 by the selective epitaxial growth process, the epitaxial seed layers may have high quality because of the high lattice quality of the exposed portion of the fin 102 on the bottom and sidewalls of the first groove 201. Since the first epitaxial layers 231 are grown based on the epitaxial seed layers, the number of the defects in the first epitaxial layers 231 may be reduced and the performance of the first epitaxial layer 231 may be improved further.

In one embodiment, the top of the first epitaxial layers 231 may be higher than the top of the first grooves 201, and the sidewalls of the first epitaxial layers 231 above the top of the first grooves 201 may have an apex protruding from the fin 102. In other embodiments, the top of the first epitaxial layers 231 may be at the same height as the top of the first grooves 201.

To avoid damages to the surface of the first epitaxial layers 231 in the subsequent processes, an oxidizing process may be applied to the surface of the first epitaxial layers 231 after forming the epitaxial layers 231 but before forming a second mask layer. Oxide protection layers (not shown in the figures) may be formed on the surface of the first epitaxial layers 231. The oxidizing process may be a dry oxygen oxidization, a wet oxygen oxidization or a water vapor oxidization.

In some embodiments, the first mask layer 106 may be retained after forming the first epitaxial layers 231. In other embodiments, the first mask layer in both the PMOS and the NMOS region may be removed after forming the first epitaxial layers.

Figure 15:
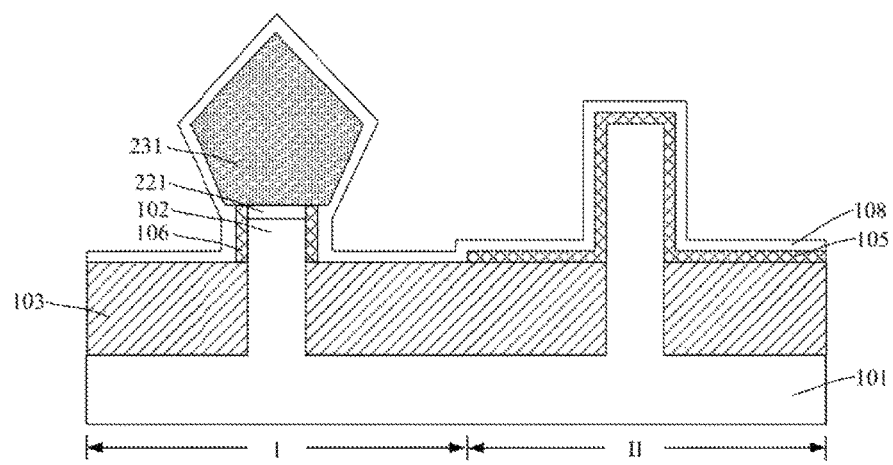

As shown in FIG. 15, a second mask layer 108 may be formed on the first epitaxial layers 231, and on the first mask layer 106 in both PMOS region I and NMOS region II.

The process and materials used to form the second mask layer 108 and the material can be the same or different from the first mask layer 106.

Figure 16:
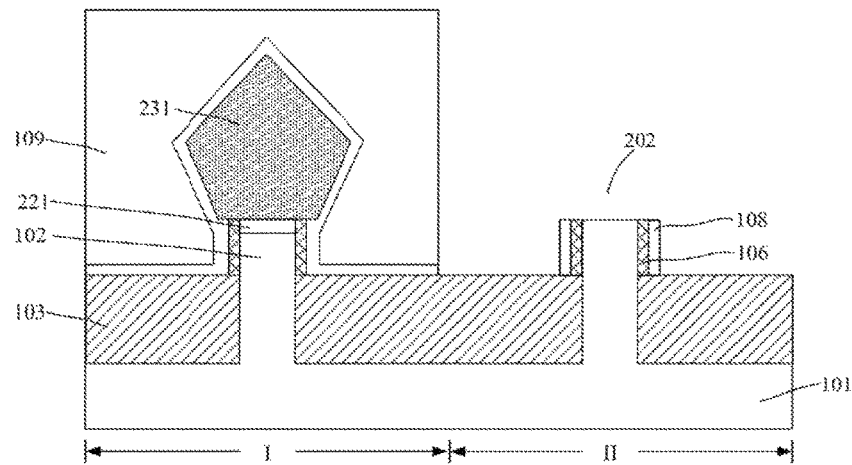

As shown in FIG. 16, a partial thickness of the fin 102 on the two sides of the second gate structure 120 (FIG. 1) may be etched to form the second grooves 202 in the fin 102.

The detailed processes to form the second grooves 202 may include: forming a second patterned layer on the second mask layer 108 in the PMOS region I and on a portion of the second mask layer 108 in the NMOS region II; and etching the second mask layer 108 in the NMOS region II, the first mask layer 106 and a portion of the fin 102 by using the second patterned layer 202 as the etch mask.

The second patterned layer 202 may be removed after forming the second grooves 202.

Figure 17:
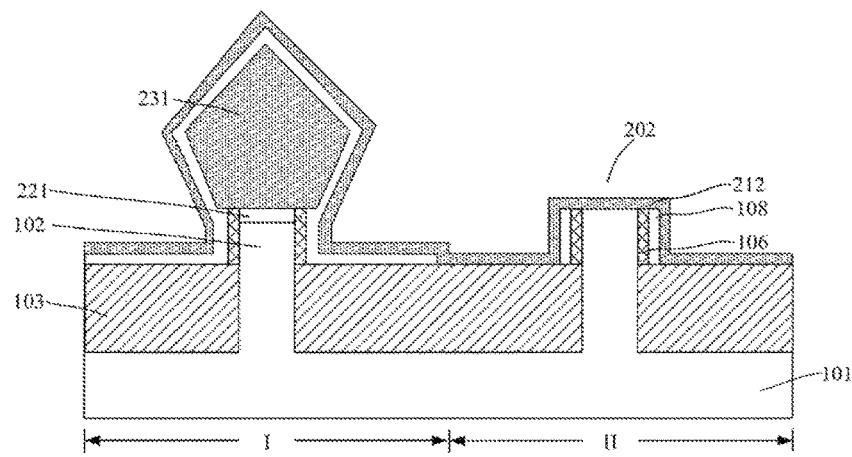
Figure 18:
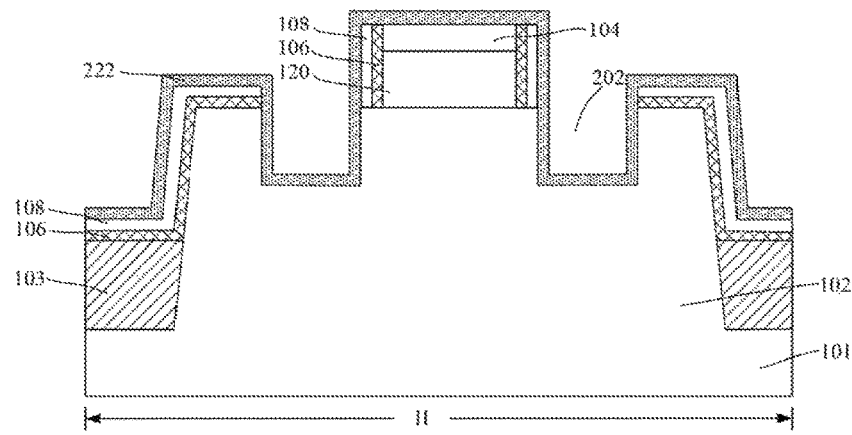

As shown in FIG. 17 and FIG.18, a second doped layer 222 with N-type ions may be formed on the bottom and sidewalls of the second grooves 202. FIG. 17 illustrates the schematic structure based on the structure in FIG. 16 and FIG. 18 is the cross-sectional view of the structure in FIG. 17 along the D-D1 direction in FIG. 1.

The second doped layer 222 provides the foundation for the second lightly doped source/drain region in the fin 102 of the NMOS region II. The second grooves 202 may have two opposite sidewalls. One sidewall is close to the second gate structure 120, and another sidewall is away from the second gate structure 120. The N-type ions in the second doped layer 222 on the sidewall close to the first gate structure 120 may diffuse into the fin 102 in the NMOS region II. This may form a second lightly doped source/drain region in the fin 102 close to the second gate structure 120 of the NMOS region II.

The second doped layer 222 may be located on the surface of the second mask layer 108 in the PMOS region I and in the sidewalls of the remaining fin 102 in the NMOS region II. The second mask layer 108 may block the diffusion of the N-type ions in the first doped layer 222 to the first epitaxial layers 231 and the fin 102 in the PMOS region I because it is located between the first doped layer 222 and the first epitaxial layers 231. As such, no additional photomasks are needed to cover the fin 102 in the PMOS region I. The fabrication process is therefore simplified.

The second doped layer may be made of $SiO_2$, $SiO_xN_y$, or $SiO_xC_y$. In one embodiment, the material of the second doped layer 222 may be phosphorus doped silicon glass, and the concentration of phosphorus ions may be 1E21 atom/cm$^3$ to 5E22 atom/cm$^3$.

In one embodiment, the in-situ doping atomic layer deposition method may be used to form the second doped layer 222, and the thickness may be about 2 nm to about 10 nm.

Figure 19:
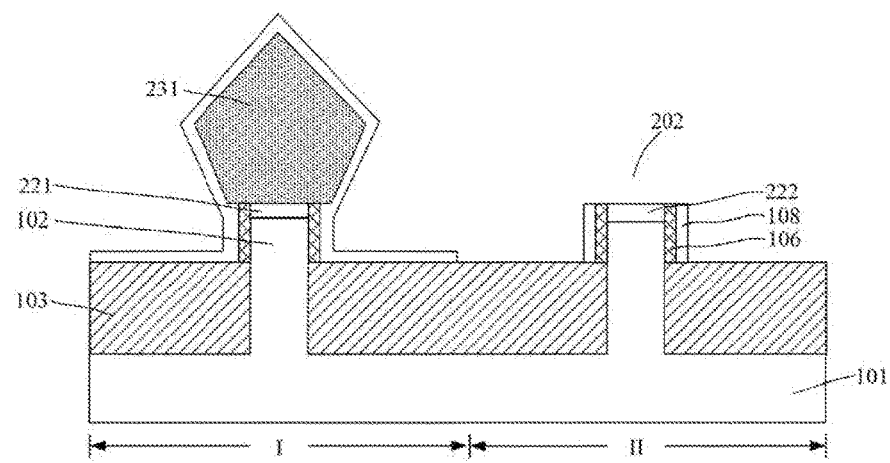
Figure 20:
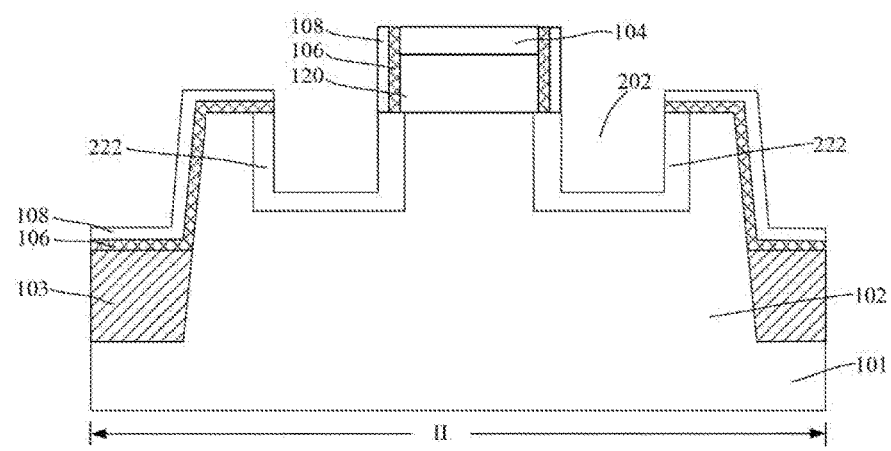

The second annealing process on the second doped layer 222 may allow the N-type ions in the second doped layer 222 to diffuse into the fin 102 in the NMOS region II to form the second lightly doped source/drain region, as shown in FIG. 19 and FIG. 20.

The N-type ions in the second doped layer 222 may diffuse to the fin 102 in the NMOS region II. This forms a second doped region in the fin 102 near the bottom and sidewalls of the second grooves 202, and the region close to the second gate structure 120 is the second lightly doped source/drain region.

The second annealing process can refer to the previous description of the first annealing process.

In one embodiment, the solid state source doping method may be used to form the second lightly doped source/drain region in the fin 102 of the NMOS region II, and the lattice damage on the second grooves 202 by the ion implantation process may be prevented to provide the exposed portion of the fin 202 on the bottom and sidewalls of the second grooves 202 with high crystal lattice quality.

The second doped layer 222 may be removed after the second annealing process.

The wet etching method may be used to remove the second doped layer 222.

In one embodiment, the second doped layer 222 may be made of SiO$_2$, and the HF solution may be used to remove the second doped layer 222.

Figure 21:
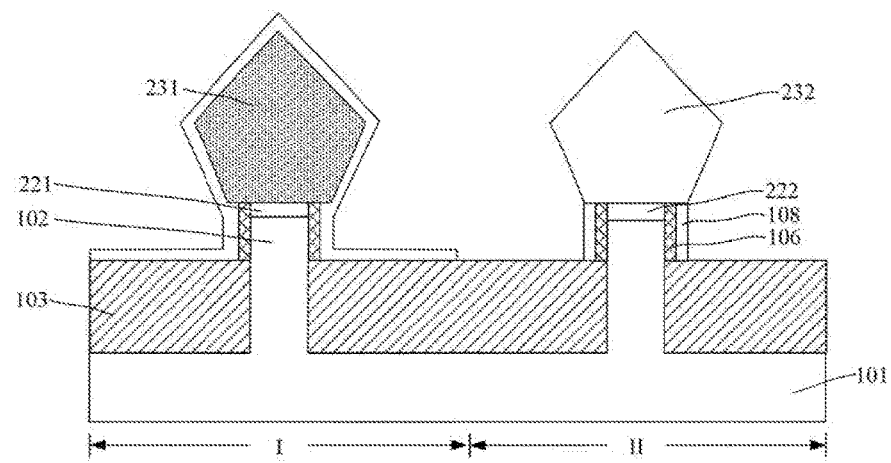
Figure 22:
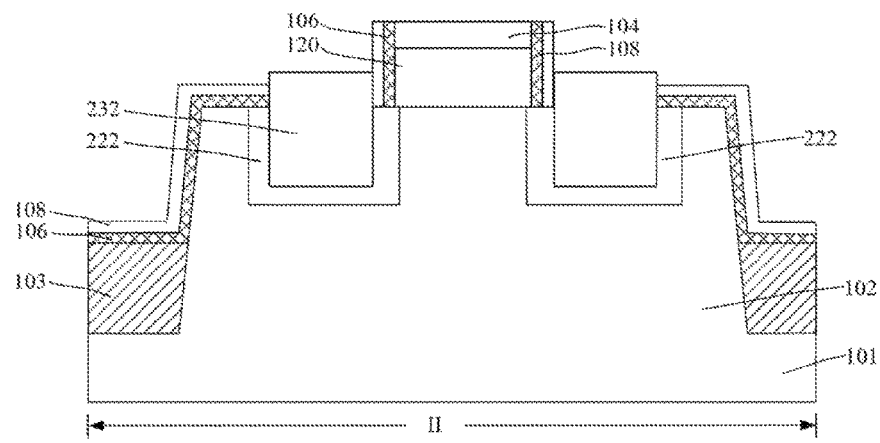
Figure 23:
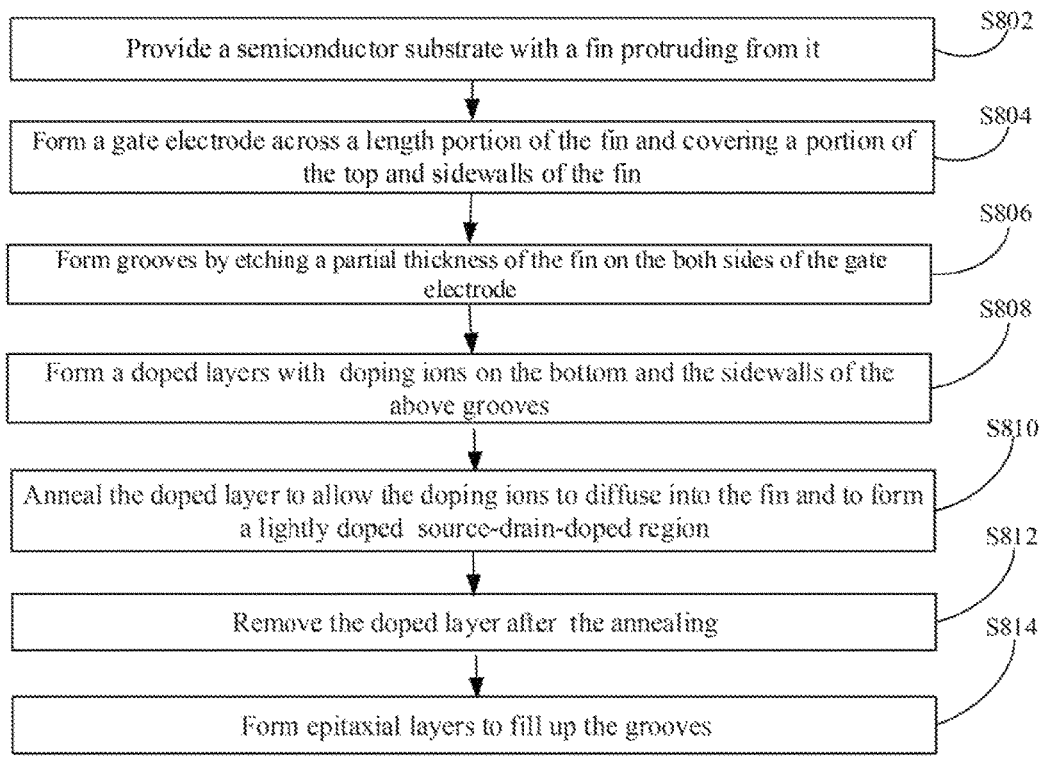
FIG. 23 illustrates an exemplary method for forming a FinFET device according to various disclosed embodiments.

The second epitaxial layers 232 may be formed to fill up the second groove 202, as shown in FIG. 21 and FIG. 22.

The second epitaxial layers 232 may provide the foundation to form the second highly doped source/drain region in the NMOS region II. The selective epitaxial growth process may be used to form the second epitaxial layers 232, and the material can be N-type doped silicon or SiC. In one embodiment, the second epitaxial layers 232 also may provide tensile stress to the channel region in the NMOS region II, which may enhance the carrier mobility in the NMOS region II. The top of the second epitaxial layers 232 may be higher than the top of the second grooves 202.

In one embodiment, the selective epitaxial growth process may be used to form the second epitaxial layers 232, and a second heavily doped source/drain region may be formed by an in situ doping of N-type ions. In another embodiment, after forming the second epitaxial layers, N-type ions may be doped in the second epitaxial layers to form the second heavily doped source/drain region. In some embodiments, before the selective epitaxial growing and the in situ doping of N-type ion, epitaxial seed layers may also be formed on the bottom and sidewalls of the second grooves 202 by the selective epitaxial growth process. The epitaxial seed layers may be formed by material including silicon or SiC.

Because the solid state source doping method is used to form the second lightly doped source/drain region, the lattice damage in a conventional ion implantation method may be avoided. The exposed portion of the fin 102 on the bottom and sidewalls of the second grooves 202 may have excellent crystal lattice quality. Correspondingly, the second epitaxial layers 232 formed by the selective epitaxial growth process may have a small number of defects, and the performance may be improved. When preparing the epitaxial seed layers on the bottom and sidewalls of the second grooves 202 by the selective epitaxial growth process, the epitaxial seed layers may have high quality because of the high crystal lattice quality in the exposed portion of the fin 102 on the bottom and sidewalls of the second groove 202. Since the second epitaxial layers 232 are formed based on the epitaxial seed layers, the defects in the second epitaxial layers 232 may be further reduced. The performance of the second epitaxial layers 232 may be further improved correspondingly.

In other embodiments, the second grooves and the second epitaxial layers may be formed before forming the first grooves and the first epitaxial layers.

In some embodiments, the first mask layer 106 and the second mask layer 108 may be removed after forming the first epitaxial layers 231 and the second epitaxial layers 232.

Various embodiments also provide a FinFET device as shown in FIG. 21 and FIG. 22. In one embodiment, the FinFET device may include: a base substrate including a semiconductor substrate and a fin protruding from the semiconductor substrate, a gate structure on the base substrate across a length portion of the fin and covering a portion of the top and sidewalls of the fin; grooves in a portion of the fin along the two sides of the gate structure; a lightly doped source/drain region located in the grooves on the exposed portion of the fin adjacent to the gate structure; and epitaxial layers filling the grooves.

The processes for forming the lightly doped source/drain region may include: forming a doped layer with P-type or N-type doping ions in the bottom and the sidewalls of the grooves; annealing the doped layer to allow the doping ions to diffuse into the fin and to form a lightly doped source/drain region; and removing the doped layer after annealing.

In one embodiment, the base substrate may further include the isolation structure 103. The fin 102 may be located on the semiconductor substrate 101 and the isolation structure 103 may cover a portion of the sidewalls of the fin 102. The top of the isolation structure 103 may be lower than the top of the fin 102.

The FinFET may be an NMOS device, a PMOS device or a CMOS device. When the FinFET is an NMOS device, the lightly doped source/drain region is doped with N-type ions; when the FinFET is a PMOS device, the lightly doped source/drain region is doped with P-type ions.

When a CMOS device is used to illustrate the formed Fin FET device, the base substrate may include a PMOS region I and an NMOS region II. The gate structures may include the first gate structure 110 in the PMOS region I and the second gate structure 120 in the NMOS region II.

Correspondingly, the grooves may include first grooves in the fin 102 along the two sides of the first gate structure 110 and second grooves in the fin 102 along the two sides of the second gate structure 120. The lightly doped source/drain regions may include a first lightly doped source/drain region in PMOS region I and a second lightly doped source/drain region II. The epitaxial layers may include first epitaxial layers 231 filling up the first grooves and second epitaxial layers 232 filling up the second grooves.

The FinFET device may also include a first doped region 221 in the exposed portion of the fin 102 on the bottom and sidewalls of the first grooves, and a second doped region 222 in the exposed portion of the fin 102 on the bottom and sidewalls of the second grooves.

A portion of the first doped region 221 which is close to the first gate structure 110 may form the first lightly doped source/drain region, and a portion of the second doped region 222 which is close to the second gate structure 120 may form the second lightly doped source/drain region.

The present disclosure has at least the following advantages. For example, when forming the disclosed FinFET device, the doped layer is formed on bottom and sidewalls of the grooves formed by etching a partial thickness of the fin on the two sides of the gate structure, where the doped layer is doped with P-type or N-type ions. The doped layer is annealed, and the doping ions in the doped layers diffuse into the fin to form the light source/drain doped region. The present disclosure uses the solid state source doping method to form the light source/drain doped region. This method avoids the damage to the crystal lattice of the fin on the bottom and sidewalls of the grooves in the conventional ion implantation method and makes the fins on the bottom of the grooves and the exposed fin part on the sidewalls have excellent lattice quality. Moreover, the epitaxial layers are formed after removing the doped layer in the grooves. The epitaxial layers have a small number of defects and high quality, which ultimately improves the electrical performance of the FinFET.

In an optional step, the mask layer is formed on the top and sidewalls of the fin, and on the semiconductor substrate. A first portion of the mask layer on the top and sidewalls of the fin is etched away, but a second portion of the mask layer on the sidewalls of the remaining fin part is retained, when forming a groove. The mask on the sidewalls of the remaining fin blocks the doping of the remaining fin, and prevents the unexpected doping effect on these regions.

In the optional step, the semiconductor substrate includes a PMOS region and an NMOS region. The first mask layer is formed in both the PMOS and NMOS regions before forming the first grooves in the PMOS region. The first doped layer is located on the top of the first mask layer in the NMOS region and the first mask layer blocks the diffusion of the P-type ions from the first doped layer in PMOS region to the fin in the NMOS region. As such, no additional photomasks need to be used in the NMOS region. Similarly, no additional photomasks need to be used in the PMOS region. The fabrication process is therefore simplified.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for fabricating FinFET, comprising:
   providing a semiconductor substrate with a fin protruding from the semiconductor substrate, and a gate structure on the semiconductor substrate across a length portion of the fin and covering a portion of a top and sidewalls of the fin;
   forming a mask layer on the semiconductor substrate, the top and sidewalls of the fin on both sides of the gate structure;
   etching a partial thickness of the fin on both sides of the gate structure to form grooves;
   forming a doped layer with doping ions in a bottom and sidewalls of the grooves;
   annealing the doped layer to allow the doping ions to diffuse into the fin and to form lightly doped source/drain regions;
   removing the doped layer after the annealing; and
   forming epitaxial layers to fill up the grooves.

2. The method for fabricating the FinFET according to claim 1,
   wherein forming the mask layer on the semiconductor substrate, the top and sidewalls of the fin on both sides of the gate structure includes:
   forming an initial mask layer on the semiconductor substrate, the top and sidewalls of the fin before forming the grooves;
   removing a first portion of the initial mask layer on the top and sidewalls of the part of the fin on both sides of the gate structure to be etched in the etching process of forming the grooves; and
   retaining a second portion of the initial mask layer on the sidewalls of the remaining fin on both sides of the gate structure to form the mask layer.

3. The method for fabricating the FinFET according to claim 2, wherein the doped layer is formed on the mask layer on the sidewalls of the remaining fin.

4. The method for fabricating the FinFET according to claim 2, wherein a top of the mask layer and a top of the remaining fin are coplanar with each other.

5. The method for fabricating the FinFET according to claim 1, wherein the doped layer is made of a material including $SiO_2$, SiN, $SiO_xN_y$, SiC, $SiO_xC_y$, or SiNCO.

6. The method for fabricating the FinFET according to claim 1, wherein a thickness of the doped layer is about 2 nm to about 10 nm.

7. The method for fabricating the FinFET according to claim 1, wherein annealing the doped layer includes a spike annealing or a laser annealing.

8. The method for fabricating the FinFET according to claim 1, wherein a temperature for annealing the doped layer is about 900° C. to about 1100° C.

9. The method for fabricating the FinFET according to claim 1, wherein removing the doped layer includes a wet etching method.

10. The method for fabricating the FinFET according to claim 1, wherein the epitaxial layers are formed by a selective epitaxial growth process.

11. The method for fabricating the FinFET according to claim 10, wherein the epitaxial layers are in-situ doped with doping ions same type as in the doping ions in the doped layer.

12. The method for fabricating the FinFET according to claim 10, wherein the epitaxial layers are doped after forming the epitaxial layers and have doping ions same type as the doping ions in the doped layer.

13. The method for fabricating the FinFET according to claim 10, wherein:
   the semiconductor substrate includes a PMOS and an NMOS region,
   fins are located on both the PMOS and the NMOS region; and
   gate structures includes a first gate structure in the PMOS region and a second gate structure in the NMOS region, and
   the method further includes:
   etching a partial thickness of the fin to form first grooves on both sides of the first gate structure;
   forming a first doped layer on a bottom and sidewalls of the first grooves with P-type ions;
   annealing the first doped layer to allow the P-type ions to diffuse into the fin on the PMOS region to form a first lightly doped source/drain region;
   removing the first doped layer;
   forming first epitaxial layers to fill up the first grooves;
   etching a partial thickness of the fin on both sides of the second gate structure to form second grooves;
   forming a second doped layer on a bottom and sidewalls of the second grooves with N-type ions;

annealing the second doped layer to allow the N-type ions to diffuse to the fin on the NMOS region to form a second lightly doped source/drain region;

removing the second doped layer; and forming second epitaxial layers to fill up the second grooves.

14. The method for fabricating the FinFET according to claim 13, further including:

forming a first mask layer on the semiconductor substrate, on top and sidewalls of the fins in the PMOS region and the NMOS region; and when forming the first grooves, removing a portion of the first mask layer on the top and sidewalls of the fin in the PMOS region.

15. The method for fabricating the FinFET according to claim 14, further including:

forming a first patterned layer on the first mask layer in the NMOS region and on a portion of the first mask layer of the PMOS region, and before forming the first grooves, etching the exposed portion of the first mask layer in the PMOS region and a partial thickness of the fin by using the first patterned layer as an etch mask.

16. The method for fabricating the FinFET according to claim 14, wherein the first doped layer is further located on the first mask layer in the NMOS region and on the first mask layer on sidewalls of the remaining fin in the PMOS region.

17. The method for fabricating the FinFET according to claim 13, wherein:

the second grooves are formed after forming the first grooves;

a second mask layer is formed on the first epitaxial layers, on the first mask layer in the PMOS region and the NMOS region; and the second grooves are formed by:

forming a second patterned layer on the second mask layer in the PMOS region and on a portion of the second mask layer in the NMOS region, and etching the second mask layer, the first mask layer and a partial thickness of the fin in the NMOS region by using the second patterned layer as an etch mask.

18. The method for fabricating the FinFET according to claim 10, further including:

forming an isolation layer on the semiconductor substrate and covering a portion of the sidewalls of the fins, wherein the isolation layer has a top lower than a top of the fins.

19. The method for fabricating the FinFET according to claim 1, wherein the sidewalls of the grooves have a surface coinciding with a surface of the mask layer on a side surface of the gate structure.

* * * * *